(12) United States Patent
Agarwal et al.

(10) Patent No.: US 7,105,899 B2
(45) Date of Patent: Sep. 12, 2006

(54) TRANSISTOR STRUCTURE HAVING REDUCED TRANSISTOR LEAKAGE ATTRIBUTES

(75) Inventors: Vishnu K. Agarwal, Boise, ID (US); Fred Fishburn, Boise, ID (US); Rongsheng Yang, Meridian, ID (US); Howard E. Rhodes, Boise, ID (US); Jeffrey A. McKee, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/053,300

(22) Filed: Jan. 17, 2002

(65) Prior Publication Data

US 2003/0132428 A1 Jul. 17, 2003

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .................. 257/374; 257/499; 257/506
(58) Field of Classification Search ............... 257/369, 257/374, 394, 395, 396, 499, 501, 506, 510
See application file for complete search history.

(56) References Cited

U.S. PATENT DOCUMENTS

| | | | |
|---|---|---|---|
| H204 H * | 2/1987 | Oh et al. .................. 438/433 |
| 5,223,730 A | 6/1993 | Rhodes et al. ............ 257/301 |
| 5,405,788 A | 4/1995 | Manning et al. .......... 438/241 |
| 5,661,045 A | 8/1997 | Manning et al. .......... 438/286 |
| 5,798,553 A * | 8/1998 | Furukawa et al. ......... 257/394 |
| 5,939,765 A * | 8/1999 | Zheng et al. .............. 257/510 |
| 5,945,724 A * | 8/1999 | Parekh et al. ............. 257/510 |
| 6,372,601 B1 | 4/2002 | Dickerson et al. |
| 6,515,889 B1 * | 2/2003 | Salling et al. ............. 365/145 |
| 6,630,706 B1 | 10/2003 | Yang et al. ................ 257/310 |

* cited by examiner

*Primary Examiner*—Hoai Pham
(74) *Attorney, Agent, or Firm*—Schwegman, Lundberg, Woessner & Kluth, P.A.

(57) ABSTRACT

Undesirable transistor leakage in transistor structures becomes greatly reduced in substrates having a doped implant region formed via pulling back first and second layers of a process stack. A portion of the substrate, which also has first and second layers deposited thereon, defines the process stack. The dopant is selected having the same n- or p-typing as the substrate. Through etching, the first and second layers of the process stack become pulled back from a trench wall of the substrate to form the implant region. Occupation of the implant region by the dopant prevents undesirable transistor leakage because the electrical characteristics of the implant region are so significantly changed, in comparison to central areas of the substrate underneath the first layer, that the threshold voltage of the implant region is raised to be about equivalent to or greater than the substantially uniform threshold voltage in the central area.

47 Claims, 8 Drawing Sheets

(PRIOR)

(PRIOR)

TRANSISTOR STRUCTURE HAVING REDUCED TRANSISTOR LEAKAGE ATTRIBUTES

FIELD OF THE INVENTION

The present invention relates generally to isolation structures that separate transistor structures in semiconductor devices. In particular it relates to transistor structures having reduced transistor leakage attributes. Even more particularly it relates to shallow trench isolation structures separating transistor structures that are useful in a variety of applications such as memory devices.

BACKGROUND OF THE INVENTION

In modern semiconductor applications, populously packed transistors occupy a single wafer. To operate, the individual transistor components require electrical isolation. As such, many individuals, corporations and businesses have developed and continually strive for new techniques to achieve isolation. One popular recent technique, known as trench isolation, forms trenches or openings between adjacent components.

Commonly, depending upon application, trench isolation falls into one of three processing categories: shallow (or shallow trench isolation, STI), with trenches less than about one micron deep; moderate, with trenches from about one to about three microns; and deep, with trenches greater than about three microns.

In a typical trench isolation process to form a standard isolation structure, a wafer is provided with successively deposited dielectric layers thereon, usually a pad oxide and a nitride layer. The dielectrics are etched first and then the wafer. This results in a trench. A liner oxide for the trench is grown and the trench is oxide filled, usually by chemical vapor deposition (CVD). The oxide may be annealed and the entire structure is planarized, usually by chemical mechanical polishing (CMP). Then, the dielectric layers are removed by wet etch and a thin, sacrificial layer of oxide is grown to anneal wafer surface damage. This is followed by another wet etch. The gate oxide is grown, poly deposited and gate patterned.

Until recently, however, the foregoing techniques were sufficient for many applications. But with a device such as a dynamic random access memory (DRAM) array with sub-quarter micron dimensions requiring multitudes of highly-densely integrated, extremely low power transistors, even the slightest amount of transistor leakage may cause retention time failures in memory cells. As such, the state of the art, especially DRAM's, demand more robust isolation structures that completely prevent or greatly reduce undesirable transistor leakage.

SUMMARY OF THE INVENTION

The above-mentioned and other problems become solved by applying the apparatus, method and system principles and teachings associated with the hereinafter described transistor structures having reduced transistor leakage attributes.

In one embodiment, undesirable transistor leakage in a transistor structure becomes greatly reduced in substrates having a doped implant region formed via pulling back first and second layers of a process stack. A portion of the substrate, which also has first and second layers successively deposited thereon, defines the process stack. The dopant is selected having the same n- or p-typing as the substrate. Through etching, the first and second layers of the process stack become pulled back from a trench wall of the substrate to form the implant region. The implant region is then doped. Occupation of the implant region by the dopant prevents undesirable transistor leakage because the electrical characteristics of the implant region are so significantly changed, in comparison to central areas of the substrate underneath the first layer, that the threshold voltage of the implant region (particularly a corner region comprising a part thereof) is raised to be about equivalent to or greater than the substantially uniform threshold voltage in the central area. Current flows in the implant and corner regions will, now, not begin until or after current begins flowing in the central region.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION OF THE PREFERRED EMBODIMENTS

Figure 1A:
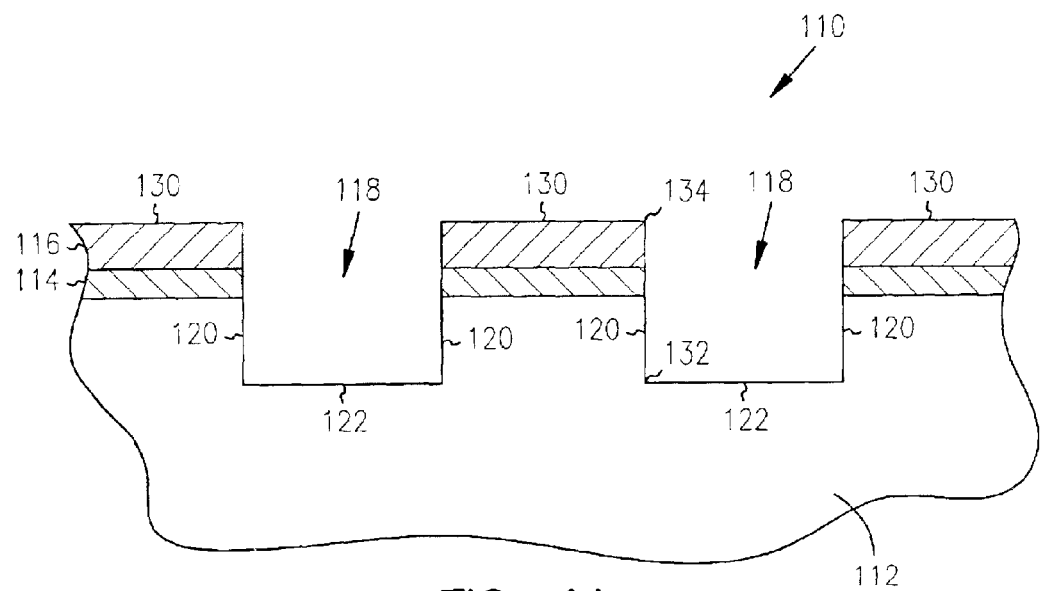
FIG. 1A is a diagrammatic, fragmentary, cross-sectional view of a structure in accordance with the prior art.

In the following detailed description of the preferred embodiments, reference is made to the accompanying drawings which form a part hereof, and in which is shown by way of illustration, specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The terms substrate and wafer used in this specification include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. The following detailed description is, therefore, not to be taken in a limiting sense, and the scope of the present invention is defined only by the appended claims and their equivalents.

FIGS. 1–6, and the description associated therewith, use a reference numeral convention where the first digit of the reference numeral corresponds to the figure and the following two digits correspond to like elements throughout the description. For example, the substrate described in the figures has a reference numeral of 112, 212, 312, etc., corresponding to the substrate X12 in FIGS. 1, 2, 3, etc., where X is the number of the figure in which the reference numeral appears.

With reference to FIG. 1A, a structure 110 that will ultimately become a transistor isolation structure of the present invention is shown at an early processing phase well known to those skilled in the art. The structure 110, in fragmentary view, comprises a substrate 112 with a first layer 114 and a second layer 116 successively deposited thereon. Preferably, the first and second layers are dielectrics. More preferably, the first layer is an oxide layer such as silicon dioxide while the second layer is a nitride layer such as silicon nitride. The nitride layer is generally in a thickness range from about 300 Å to about 1000 Å.

Through various patterning and etching processes, a plurality of trenches 118 are formed in the substrate 112 that serve to isolate three processing related stacks, or process stacks 130, from one another. As used herein, a process stack includes that portion of the substrate 112 beginning at point 132 and extending away from a surface 122 of the substrate 112 toward a point 134 at the top of the second layer 116. The surface 122, while defined as associated with the substrate, may alternatively be considered as defining a bottom of the trench 118. As is apparent from the figure, this process stack also includes first layer 114. While the figure depicts three process stacks, it should be appreciated that the present invention is not limited to any particular number.

Figure 1B:
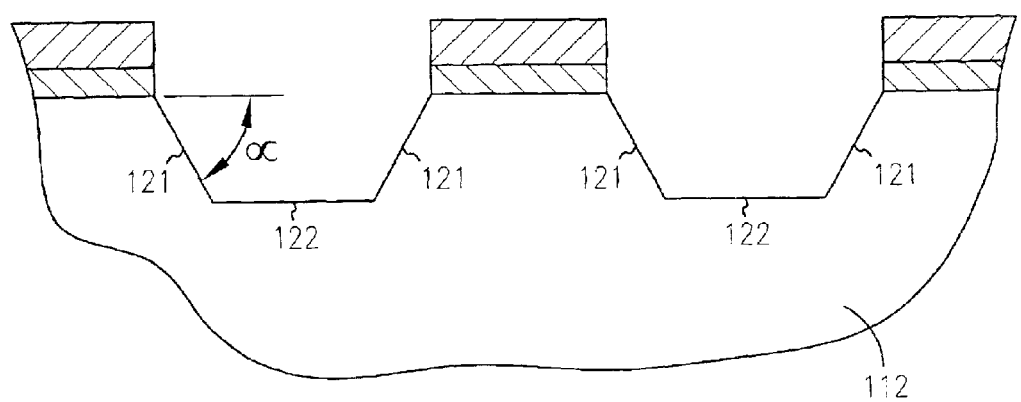
FIG. 1B is a diagrammatic, fragmentary, cross-sectional view of the substrate of FIG. 1A having exaggerated angular trench walls.

Trenches 118 also have a trench wall 120 defined by the substrate 112. As illustrated in FIG. 1A, the trench walls 120 are generally perpendicular to the surface 122 of the substrate 112. It is well known, however, that trench walls, while approaching near perpendicular conditions, rarely achieve such an orientation. They generally slope as shown in FIG. 1B at wall 121. Angle α is typically about 89 degrees. With this in mind, the figures will show trench walls as perpendicular to surface 122 but it should be remembered that the walls are slightly angled.

The patterning and etching processes used to form trenches 118 preferably include, but are not limited to, depositing a patterned photoresist layer (not shown) on the second layer 116 to serve as a mask in a first etch. In the first etch, both the first and second layers are etched down to the substrate 112 but not into the substrate. In one embodiment the etch uses well known dry plasma conditions and $CH_2F_2$/$CCF_4$ chemistry.

Next, substrate etching occurs. In one embodiment it occurs in two parts via a second and third etch. The second etch commonly referred to as a trench initiation etch, utilizes a timed dry plasma condition and $CF_4$/HBr chemistry to etch the substrate 112 to a depth of about 500 Å. Often times the second etch cleans the substrate 112 and removes substrate defects prior to the third etch or final trenching.

The third etch is a timed etch, and of almost entirely HBr etchant, etches the substrate 112 to the desired depth. Intuitively, the longer the etch, the deeper the trench, and, vice versa. Again, for shallow trenches in STI structures, the depth is less than or equal to about 1 micron deep.

Figure 2:
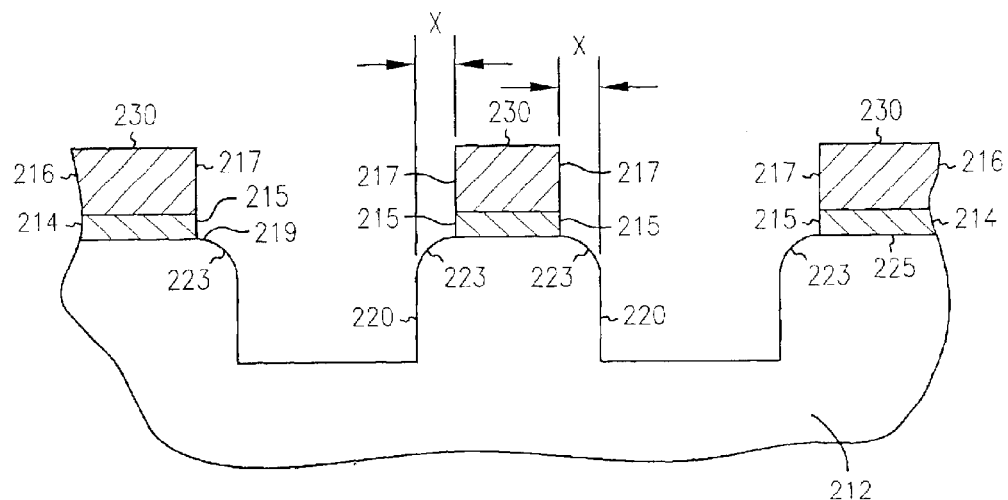
FIG. 2 is a diagrammatic, fragmentary, cross-sectional view of a preliminary processing phase of a transistor structure in accordance with the teachings of the present invention having first and second layers of a process stack pulled-back from a trench wall.

With reference to FIG. 2, and in accordance with the teachings of the present invention for transistor structures having reduced transistor leakage attributes, respective edges 215 and 217 of the first and second layers 214, 216 of the process stack 230 are "pulled-back" a pull back distance, x, from the trench wall 220. In a preferred embodiment, the pull back distance, x, is from about 25 Å to about 300 Å. While the shape of the process stack 230 has changed in cross-sectional area from that of process stack 130, it will still be referred to as a process stack having reference numeral X30 (where X is the number of the figure). The reasoning for this is based upon the fact that process stack 230 remains a stack of materials implicated in the processing of a transistor structure of the present invention.

It should be appreciated that while the edges 215 and 217 of the first and second layers have been shown as completely pulled back the pull back distance, x, it is likely that some residual first layer remains on the substrate at an area 219 in an amount from about 5 Å to about 10 Å.

It should be further appreciated that during this pull back step, a corner region 223 of the substrate 212 develops a rounded contour. Rounded contours such as these, in general, have an electric field associated therewith that is generally higher than that of a non-rounded or generally flat area such as central area 225 of substrate 212 just underneath the first layer 214. As a result, the corner region 223 with rounded contour would require less threshold voltage to begin flowing current in a transistor formed with this process stack than in comparison to the threshold voltage (substantially uniform and higher than the corner region) of the central area 225. Undesirably, this might cause the transistor to turn on prematurely.

In a preferred embodiment, the pull back process is any variety of wet etching. In another embodiment it is an HF etch followed by a phosphoric acid ($H_3PO_4$) etch from between 30 seconds to 10 minutes depending upon relative chemical strength and temperature. In one embodiment, the temperature is anywhere from room temperature to 150° C. In still another embodiment the etch is an HF etch followed by polyethylene glycol (PEG) or polypropylene glycol (PPG).

It will be appreciated that the pull back processing steps of FIG. 2, may occur with or without a photoresist layer deposited on top of the second layer.

Figure 3:
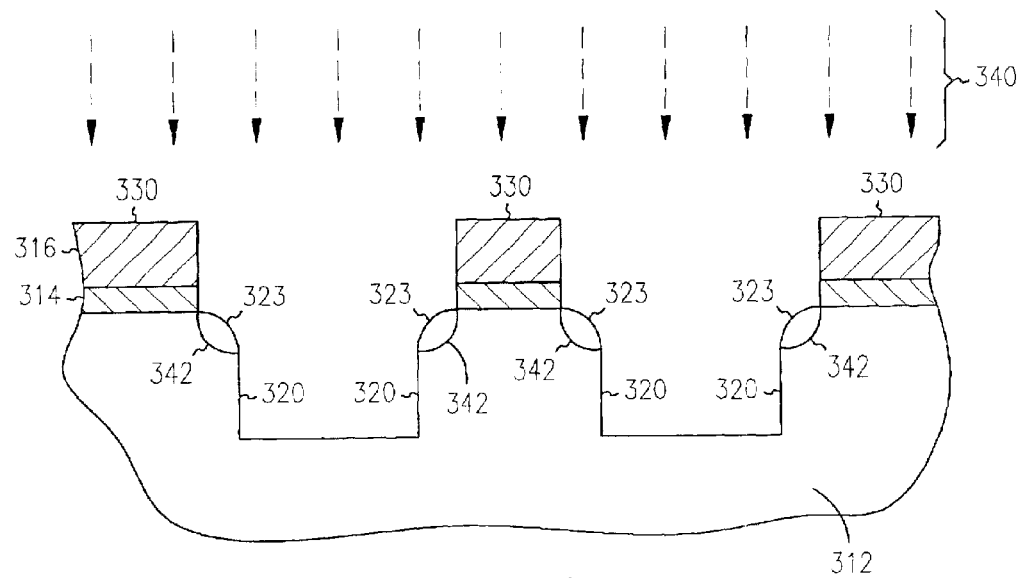
FIG. 3 is a diagrammatic, fragmentary, cross-sectional view of a preliminary processing phase of a transistor structure in accordance with the teachings of the present invention having implant regions.

With reference to FIG. 3, an implant region 342 in substrate 312 is formed when the first and second layers 314, 316 of the process stack 330 are pulled back the requisite pull back distance from the trench wall 320. It should be noticed that corner region 323 of substrate 312 having round contours comprises a part of this implant region 342.

Once the implant region is formed, it is doped with an impurity or dopant 340. Preferably, this doping occurs via a vertical implanting arrangement well known in the art so that the implant region may become fully occupied with dopant. If angular implant arrangements or poorly designed vertical arrangements were to be used, it is likely the implant regions would be less than optimally populated with dopant. This is not to say, however, that the present invention cannot be used with such inferior arrangements. In fact, in one embodiment, the wafer is tilted so that the implant is angular and in a range from 0–60°, especially 0–45°.

The dopant 340 material is preferably selected in matched accordance with the substrate type. For example, if substrate 312 is an n-type substrate, dopant 340 is an n-type dopant. If substrate 312 is a p-type substrate, then dopant 340 is a p-type dopant. In a preferred embodiment the dopant is Boron. In other embodiments, if the substrate is a p-type substrate, the dopant is one of Indium or $BF_2$. In still another embodiment, the implant comprises two parts, Indium then $BF_2$, Indium then Boron or Boron then $BF_2$. If the substrate is an n-type substrate, the dopant is one of Arsenic, Antimony or Phosphorous.

Recalling that the second layer, in a preferred embodiment, is nitride in a thickness range from about 300 Å to about 1000 Å, the implant energy of the dopant is selected so that the dopant ions sufficiently penetrate the substrate 312 in implant region 342 while avoiding penetration of the nitride layer. To achieve this, a preferred implant energy range for $BF_2$ is selected from about 5 to about 25 keV with a more preferred range being less than or equal to about 10 keV.

Figure 4A:
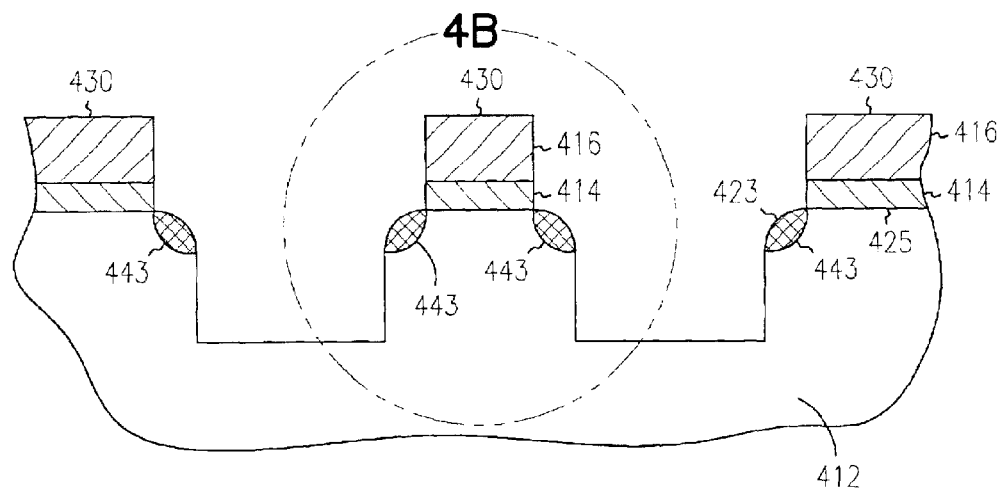
FIG. 4A is a diagrammatic, fragmentary, cross-sectional view of an implant region in accordance with the teachings of the present invention having a dopant therein.

In reference to FIG. 4A, the implant region is shown following the doping step as occupied by the dopant 443. In a preferred embodiment, the dopant 443 penetrates the substrate 412 in a thickness range from about 200 Å to about 1000 Å. Recalling, from FIG. 1B, that the actual orientation of trench walls 121 in relation to surface 122 is sloping, it will be appreciated that as the generally vertical implantation of ions occurs during the doping step, some small portion of the dopant ions will actually be implanted into the trench walls. In practice, the percentage of implant ions of the total flux of the implant that penetrates the angled trench walls depends on the trench slope, the energy of the implant and the actual implanted ion.

As a result of the foregoing pull back and doping, the electrical characteristics of the implant and corner regions are changed. It is so significant, in comparison to the central area 425, that the threshold voltage of the implant region (particularly the corner region) is raised to be about equivalent to or greater than the substantially uniform threshold voltage in the central area 425. Current flow in the corner region 423 will, now, not begin until or after current begins flowing in central region 425. Advantageously, this completely prevents or greatly reduces the undesirable transistor leakage associated with prior art devices.

Figure 4B:
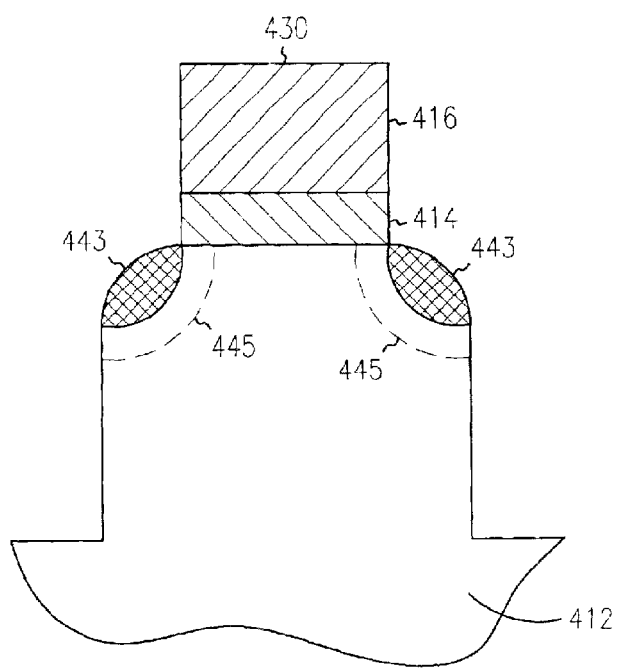
FIG. 4B is an enlarged diagrammatic, fragmentary, cross-sectional view of the single process stack depicted in the dashed circle of FIG. 4A.

With reference to FIG. 4B, dopant 443 occupying the implant region in substrate 412 of process stack 430 will likely expand into migration region 445 with further processing steps. How fast it occurs and how large of an area this migration region consumes will be a function of both the parameters, such as time, temperature, chemicals, etc., of the future processing steps and the actual dopant material selected.

Figure 5:
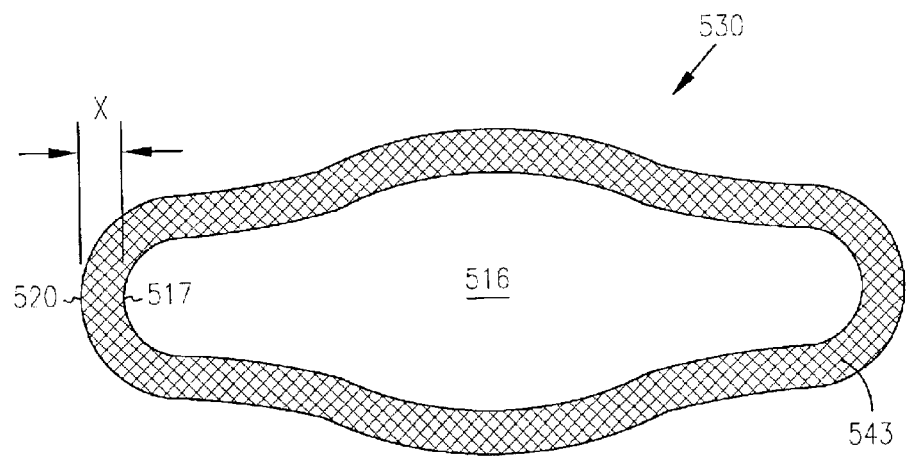
FIG. 5 is a top view of one embodiment of a single process stack in accordance with the teachings of the present invention having a dopant in the implant region.

In the top view of process stack 530 in the embodiment shown in FIG. 5, it can be seen that the implant region, and the dopant 443 occupying the region, formed by pulling back the edges of the first and second layers, is substantially symmetrical about the first and second layers (although only edge 517 and second layer 516 can be seen). In other words, the pull back distance, x, from the trench wall 520 remains substantially the same distance from edge 517 of the second layer 516 no matter where it is measured. In this manner, the electrical characteristics of the implant region will be substantially consistent throughout the implant region which lends predictability to transistor structures formed via process stacks of this type. Although not critical to this invention, the concentration of the dopant in the substrate in the implant region may be defined as 1 part per million in a preferred embodiment. The type of application in which a transistor structure of the present invention would be used will dictate the concentration amount.

Figure 6A:
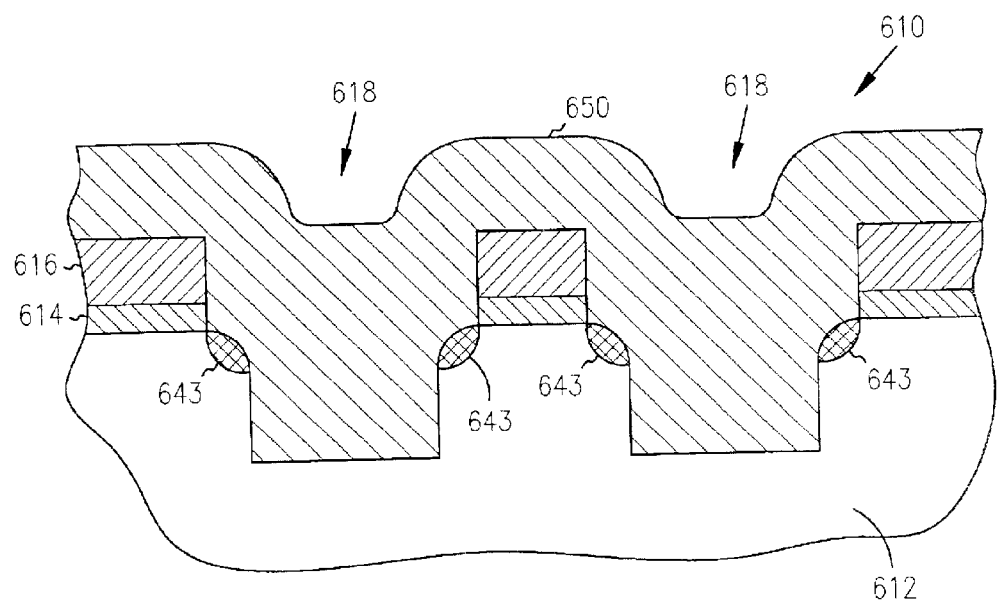
FIG. 6A is a diagrammatic, fragmentary, cross-sectional view of a transistor structure in accordance with the teachings of the present invention having a dopant in the implant region at a processing step subsequent to FIG. 4A.
Figure 6B:
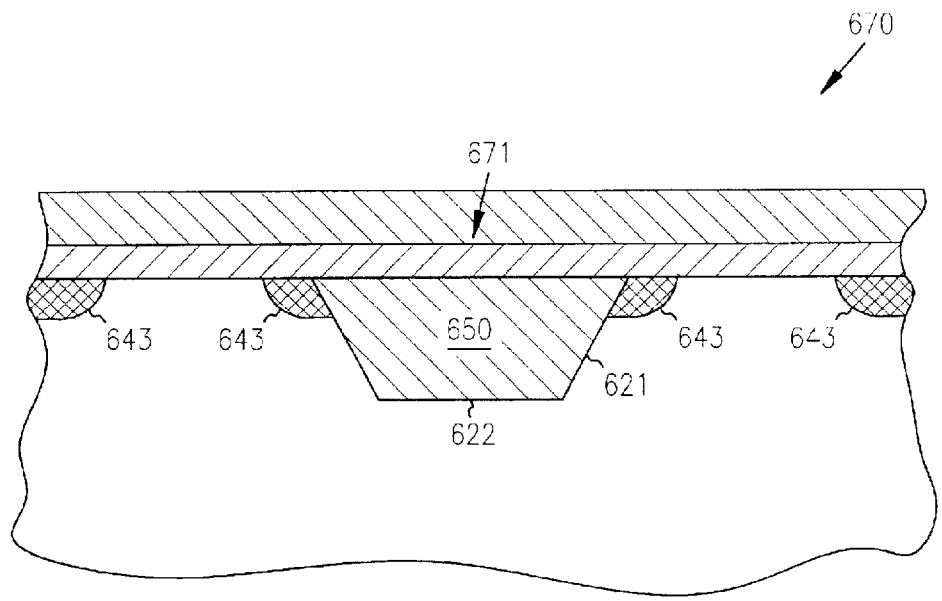
FIG. 6B is a diagrammatic, fragmentary, cross-sectional view of one embodiment of a transistor structure in accordance with the teachings of the present invention having been fully formed.

With reference to FIG. 6A, a third layer 650, preferably another oxide layer, perhaps a high density plasma oxide, is formed about the processing stacks to overlie them and fill trenches 618. Recalling that this invention may be practiced with or without a photoresist layer on top of second layer 616, in the event a photoresist layer is present, it would likely be removed before deposition of the third layer 650. Thereafter, planarization occurs.

In a preferred embodiment, a CMP step planarizes structure 610. Such step stops at an upper surface of second layer 616 whereupon the second layer 616 is removed via wet etching thereby exposing the first layer 614. Then, the first layer 614 is removed via another wet etch.

Such removal of the second and first layers, unfortunately, often leaves a "dip" where third layer 650 plugs trench 618. A technique for overcoming this problem, that can be utilized with the teachings of this invention, is described in a related, co-pending, commonly assigned, U.S. patent application "Isolation Region Forming Methods," attorney docket no. M122-930, Ser. No. 09/146,838, filed on Sep. 3, 1998 and herein incorporated by reference.

Annealing is accomplished by growing a sacrificial oxide layer, followed by still another wet etch. Finally, the gate oxide is grown, poly deposited and gate patterned. The result is the transistor structure 670 in FIG. 6B.

Third layer 650, having been planarized, plugs former trench 618 to form an isolation structure 671. Exaggerated angular walls 621 meet with surface 622 similar to FIG. 1B. The isolation structure (STI) near the active areas or conductive regions (i.e., the implant region now occupied by dopant 643) formed in the substrate 612 serves to isolate the transistors better than previous conventional approaches.

As is known, substrates or wafers contain a plurality of dies. Often times as many as one thousand. These dies (alternatively, chips), which have a plurality of integrated circuit elements therein, must be separated from adjacent dies before packaging.

In the remaining figures, wafers and dies will be described as they are used in variety of applications. According to the teachings of the present invention, some of these dies, it will be appreciated, contain at least one of the transistor structures of the present invention having reduced transistor leakage attributes. They also contain other integrated circuit elements such as capacitors, transistors, lines, interconnects, plugs, pads, I/O connections, insulators and other known elements.

Figure 7:
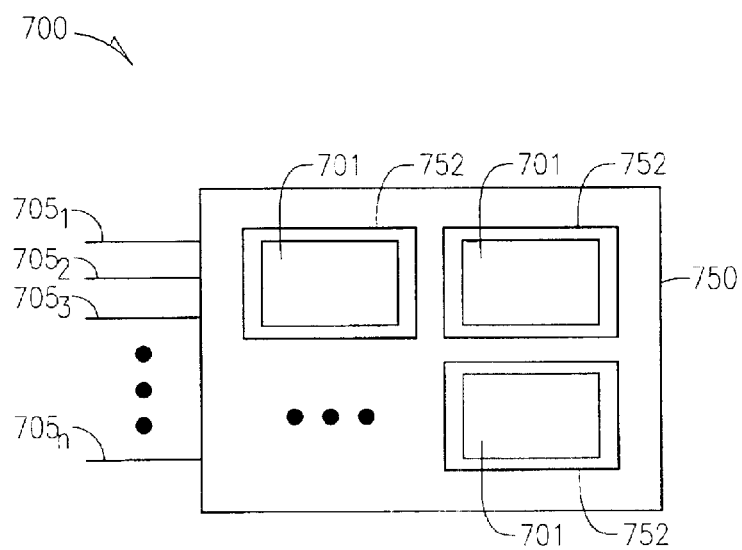
FIG. 7 is a diagrammatic view of a circuit module in accordance with the teachings of the present invention.

As shown in FIG. 7, and hereinafter without regard to the previous reference numeral convention used in FIGS. 1–6, two or more dies 701 may be combined, with or without protective casing, into a circuit module 700 to enhance or extend the functionality of an individual die 701. Circuit module 700 may be a combination of dies 701 representing a variety of functions, or a combination of dies 701 containing the same functionality. In one embodiment, circuit module 700 includes at least one socket, slot, recess or the like 752 into which the die 701 is received. Slot 752 in one embodiment is a circuit board 750. Slot 752, in another embodiment, represents a mount including land patterns. In any embodiment, dies 701 may be received by slot 752 in a pick-and-place operation by suitable pick-and-place machines.

Some examples of a circuit module 700 include memory modules, device drivers, power modules, communication modems, processor modules and application-specific modules, and may include multilayer, multichip modules. Such modules will have a chip receiver in which a chip according to the present invention is inserted. Circuit module 700 may be a subcomponent of a variety of electronic systems, such as a clock, a television, a cell phone, a personal computer, an automobile, an industrial control system, an aircraft and others. Such modules will have a circuit module receiver in which a circuit module according to the present invention is inserted. Circuit module 700 will have a variety of leads $705_I$ through $705_N$ extending therefrom providing unilateral or bilateral communication and control in its particular application.

Figure 8:
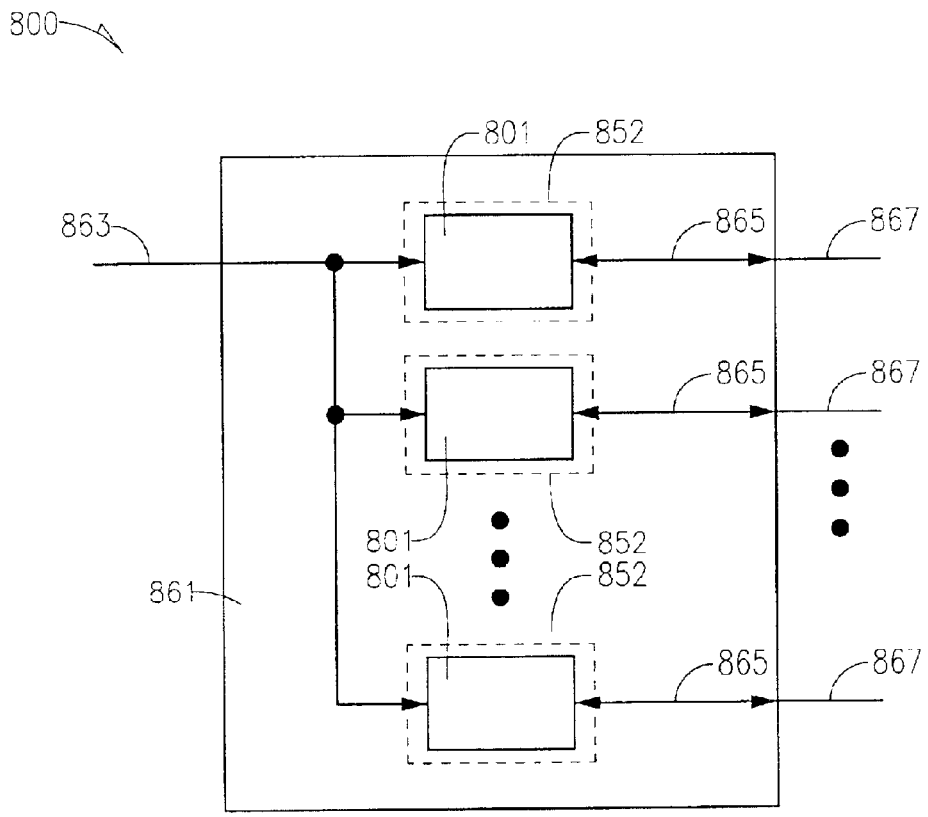
FIG. 8 is diagrammatic view of a memory module in accordance with the teachings of the present invention.

FIG. 8 shows one embodiment of a circuit module as memory module 800. Memory module 800 contains multiple memory devices 801 contained on support 861. Representative memory devices include, but are not limited to DRAM, SRAM, SDRAM, EEPROM, flash memory, ROM, etc. In one embodiment, support 861 includes slots 852 for receiving memory devices 801. The number of memory devices generally depends upon the desired bus width and the desire for parity. Memory devices 801 include at least die in accordance with to the present invention. The support 861 includes sockets, slots, recesses or the like 852, each adapted to receive a memory device 801 and provide electrical communication between a bus and memory device 801. Memory module 800 accepts a command signal from an external controller (not shown) on a command link 863 and provides for data input and data output on data links 865. The command link 863 and data links 865 are connected to leads 867 extending from the support 815. Leads 867 are shown for conceptual purposes and are not limited to the position shown in FIG. 8.

Figure 9:
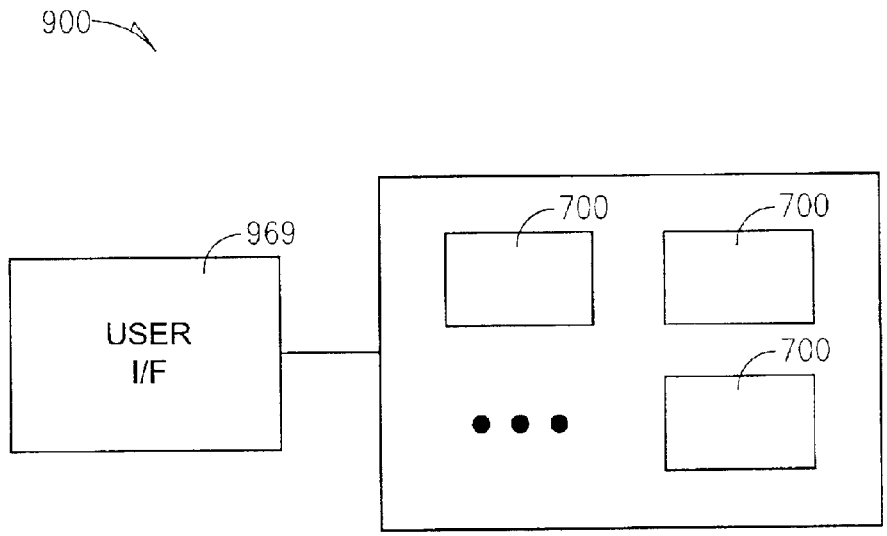
FIG. 9 is a diagrammatic view of an electronic system in accordance with the teachings of the present invention.

FIG. 9 shows one embodiment of an electronic system 900 containing one or more circuit modules 700. At least one of the circuit modules 700 contains a die in accordance with the present invention. Electronic system 900 generally contains a user interface 969. User interface 969 provides a user of the electronic system 900 with some form of control or observation of the results of the electronic system 900. Some examples of user interface 969 include the keyboard, pointing device, monitor or printer of a personal computer; the tuning dial, display or speakers of a radio; the ignition switch, gauges or gas pedal of an automobile; and the card reader, keypad, display or currency dispenser of an automated teller machine. User interface 969 may further describe access ports provided to electronic system 900. Access ports are used to connect an electronic system to the more tangible user interface components previously exemplified. One or more of the circuit modules 700 may be a processor providing some form of manipulation, control or direction of inputs from or outputs to user interface 969, or of other information either preprogrammed into, or otherwise provided to, electronic system 900. In another embodiment, electronic system 900 includes memory modules 800. As will be apparent from the lists of examples previously given, electronic system 900 will often be associated with certain mechanical components (not shown) in addition to circuit modules 700 and user interface 969. It will be appreciated that the one or more circuit modules 700 in electronic system 900 can be replaced by a single integrated circuit. Furthermore, electronic system 900 may be a subcomponent of a larger electronic system.

Figure 10:
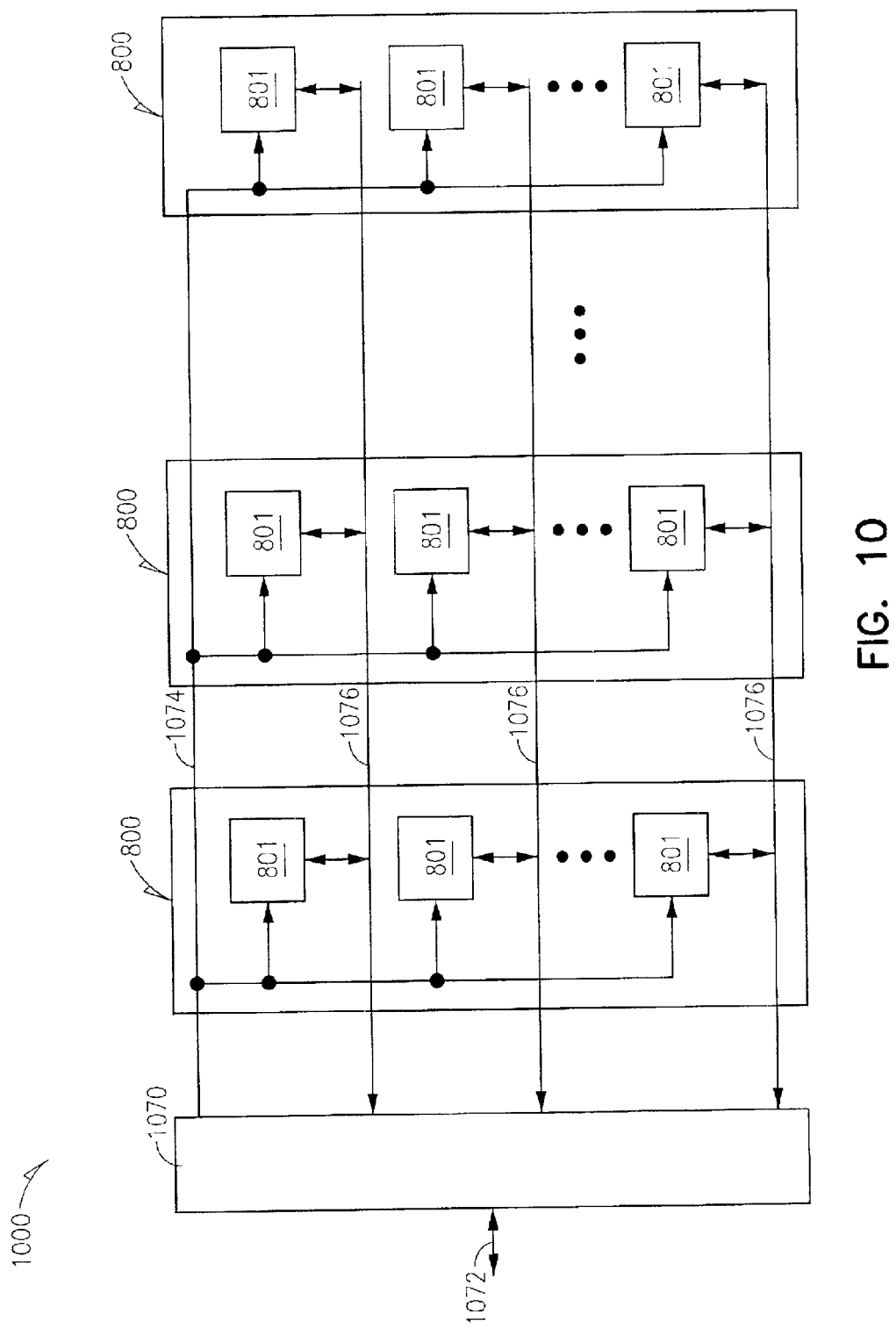
FIG. 10 is a diagrammatic view of an embodiment of an electronic system in accordance with the teachings of the present invention.

FIG. 10 shows one embodiment of an electronic system as memory system 1000. Memory system 1000 contains one or more memory modules 800 and a memory controller 1070. At least one of the memory modules 800 includes a die in accordance with the present invention. Memory controller 1070 provides and controls a bidirectional interface between memory system 1000 and an external system bus 1072. Memory system 1000 accepts a command signal from the external bus 1072 and relays it to the one or more memory modules 800 on a command link 1074. Memory system 1000 provides for data input and data output between the one or more memory modules 800 and external system bus 1072 on data links 1076.

Figure 11:
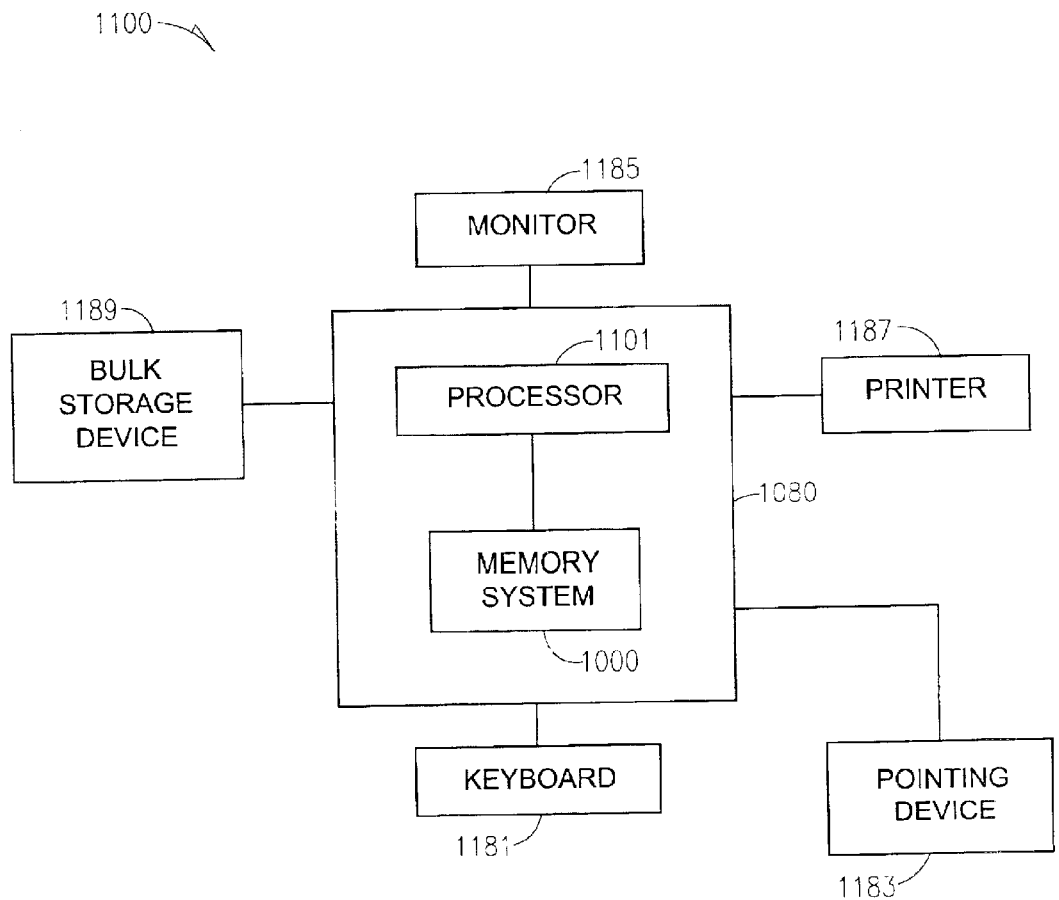
FIG. 11 is a diagrammatic view of a computer system in accordance with the teachings of the present invention.

FIG. 11 shows a further embodiment of an electronic system as a computer system 1100. Computer system 1100 contains a processor 1101 and a memory system 1000 housed in a computer unit 1080. In one embodiment, the memory system 1000 includes a die in accordance with the present invention. In another embodiment, processor 1101 includes a die in accordance with the present invention. Computer system 1100 is but one example of an electronic system containing another electronic system, i.e., memory system 1000, as a subcomponent. Computer system 1100 optionally contains user interface components. Depicted in FIG. 11 are a keyboard 1181, a pointing device 1183 such as a mouse, trackball, or joystick, a monitor 1185, a printer 1187 and a bulk storage device 1189. It will be appreciated that other components are often associated with computer system 1100 such as modems, device drivers, additional storage devices, etc. These other components, in still another embodiment, include at least one die containing an isolation structure of the present invention having reduced transistor leakage attributes. It will be appreciated that the processor 1101 and memory system 1000 of computer system 1100 can be incorporated on a single integrated circuit. Such single package processing units reduce the communication time between the processor and the memory circuit.

CONCLUSION

The above structures and fabrication methods have been described, by way of example, and not by way of limitation, with respect to transistor structures having reduced transistor leakage attributes.

In particular, transistor structures formed via pulling back first and second layers of a process stack to form a doped implant region have been described that offer the particular advantage of reduced transistor leakage. In so forming this structure, the electrical characteristics of the implant regions, and corner regions thereof, were changed so significantly in comparison to central areas underneath the first layer (typically oxide) that the threshold voltage of the implant region (particularly the corner region) is raised to be about equivalent to or greater than the substantially uniform threshold voltage in the central area. Current flows in the implant and corner regions will, now, not begin until or after current begins flowing in the central region.

The present invention has been particularly shown and described with respect to certain preferred embodiment(s). However, it will be readily apparent to those of ordinary skill in the art that a wide variety of alternate embodiments, adaptations or variations of the preferred embodiment(s), and/or equivalent embodiments may be made without departing from the intended scope of the present invention as set forth in the appended claims. Accordingly, the present invention is not limited except as by the appended claims.

What is claimed is:

1. An apparatus, comprising:
a substrate having at least one trench wall;
a first layer;
a second layer wherein the first layer, the second layer and a portion of the substrate form a process stack, the first and second layers being a pull back distance from the trench wall thereby forming an exposed implant region having a rounded corner between the portion of the substrate and the trench wall without the use of spacers covering the implant region; and
a dopant in the implant region having the same dopant type as the substrate type whereby the threshold voltage in the implant region is approximately equal to or greater than the threshold voltage on the portion of the substrate and whereby the pull back distance defines a width of the implant region which is approximately uniform around the process stack.

2. The apparatus according to claim 1, wherein the pull back distance is in a range from about 25 Å to about 300 Å.

3. The apparatus according to claim 1, wherein the pull back distance is substantially symmetrical about the second layer.

4. The apparatus according to claim 1, wherein the dopant in the implant region occupies the implant region in a concentration of about 1 part per million.

5. The apparatus according to claim 1, wherein the dopant has an implant energy in a preferred implant energy range from about 5 to about 25 keV.

6. The apparatus according to claim 1, further comprising a third layer about the process stack.

7. An apparatus, comprising:
a substrate having at least one trench wall;
a first layer;
a second layer wherein the first layer, the second layer and a portion of the substrate form a process stack, the substrate further including a central area underneath the first layer having a threshold voltage that is about substantially uniform, the first and second layers being a pull back distance from the trench wall thereby forming an exposed implant region having a rounded corner between the portion of the substrate and the trench wall without the use of spacers over the implant region; and
a dopant in the implant region having the same dopant type as the substrate type whereby the threshold voltage in the implant region is approximately equal to or greater than the threshold voltage on the portion of the substrate and whereby the pull back distance defines a width of the implant region which is approximately uniform around the process stack.

8. The apparatus according to claim 7, wherein the dopant in the implant region changes an electrical characteristic of the implant region thereby making a threshold voltage in the implant region about equivalent to or greater than a threshold voltage in the central area of the substrate underneath the first layer.

9. An apparatus, comprising:
a substrate having at least one trench wall;
a first layer;
a second layer wherein the first layer, the second layer and a portion of the substrate form a process stack, the first and second layers being a pull back distance from the trench wall thereby forming an exposed implant region having a rounded corner between the portion of the substrate and the trench wall without using spacers to cover the implant region; and
a dopant in the implant region and the substrate at the at least one trench wall region wherein the implant region has the same dopant type as the substrate type whereby the threshold voltage in the implant region is approximately equal to or greater than the threshold voltage on the portion of the substrate and whereby the pull back distance defines a width of the implant region which is approximately uniform around the process stack.

10. The apparatus according to claim 9, wherein the substrate is a P-type substrate and the dopant is a P-type dopant.

11. The apparatus according to claim 9, wherein the substrate is an N-type substrate and the dopant is an N-type dopant.

12. The apparatus according to claim 9, wherein the dopant is one of Boron, Arsenic, Antimony, Indium, Phosphorous, and BF2.

13. The apparatus according to claim 9, wherein the dopant has an implant energy in a preferred implant energy range from about 5 to about 25 keV.

14. The apparatus according to claim 13, wherein the implant energy is in a more preferred implant energy range of less than or equal to about 10 keV.

15. An apparatus, comprising:
a substrate having at least one trench wall;
a first layer;
a second layer wherein the first layer, the second layer and a portion of the substrate form a process stack, the first and second layers being a pull back distance from the trench wall thereby forming an exposed implant region having a migration region whereby the implant region has a rounded corner between the portion of the substrate and the trench wall without the use of spacers covering the implant region; and
a dopant in the implant and migration regions having the same dopant type as the substrate type whereby the threshold voltage in the implant region is approximately equal to or greater than the threshold voltage on the portion of the substrate and whereby the pull back distance defines a width of the implant region which is approximately uniform around the process stack.

16. An apparatus, comprising:
a substrate having a surface and at least one trench wall;
an oxide layer on the substrate;
a nitride layer on the oxide layer wherein the oxide layer, the nitride layer and a portion of the substrate form a process stack extending away from the surface, the oxide layer and the nitride layer being a pull back distance from the trench wall thereby forming an exposed implant region, the pull back distance being substantially symmetrical about the nitride layer and whereby the implant region has a rounded corner between the portion of the substrate and the trench wall without the use of spacers covering the implant region; and a dopant in the implant region thereby making a threshold voltage in the implant region about equivalent to or greater than a threshold voltage in a central area of the substrate underneath the oxide layer, the threshold voltage of the central area of the substrate being about substantially uniform and whereby the pull back distance defines a width of the implant region which is approximately uniform around the process stack.

17. The apparatus according to claim 16, wherein the pull back distance is in a range from about 25 Å to about 300 Å.

18. The apparatus according to claim 16, wherein the dopant is present in the substrate at the at least one trench wall.

19. The apparatus according to claim 16, wherein the at least one trench wall is angled in relation to the surface.

20. The apparatus according to claim 16, wherein the substrate further includes a corner region that comprises a part of the implant region, the corner region having a rounded contour.

21. The apparatus according to claim 16, wherein the implant region occupies a migration region adjacent to the oxide layer.

22. The apparatus according to claim 21, wherein the dopant occupies the migration region.

23. An apparatus having reduced transistor leakage attributes, comprising:
  a substrate having a surface, a corner region and at least one trench wall;
  an oxide layer on the substrate;
  a nitride layer on the oxide layer wherein the oxide layer, the nitride layer and a portion of the substrate form a process stack extending away from the surface, the oxide layer and the nitride layer being a pull back distance in a range from about 25 Å to about 300 Å from the trench wall thereby forming an exposed implant region, the pull back distance being substantially symmetrical about the nitride layer, the corner region of the substrate comprising a part of the implant region;
  whereby the implant region has a rounded corner between the portion of the substrate and the trench wall without the use of spacers covering the implant region; and
  a dopant in the implant region thereby changing an electrical characteristic or the implant region and making a threshold voltage in the corner region about equivalent to or greater than a threshold voltage in a central area of the substrate underneath the oxide layer, the threshold voltage of the central area of the substrate being about substantially uniform.

24. The apparatus according to claim 23, wherein the dopant is one of Boron, Arsenic, Antimony, Indium, Phosphorous and BF2.

25. The apparatus according to claim 23, wherein the corner region has a rounded contour.

26. The apparatus according to claim 23, wherein the implant region occupies a migration region adjacent to the oxide layer.

27. A transistor structure having reduced transistor leakage attributes, comprising:
  a substrate having a surface, a corner region and at least one trench wall;
  a transistor structure on the substrate, the transistor structure being formed from a process stack having:
    an oxide layer on the substrate;
    a nitride layer on the oxide layer; and
    a portion of the substrate wherein the process stack extends away from the surface, the oxide layer and the nitride layer being a pull back distance in a range from about 25 Å to about 300 Å from the trench wall thereby forming an implant region, the pull back distance being substantially symmetrical about the nitride layer, the corner region of the substrate having a rounded contour and comprising a part of the implant region;
  whereby the implant region has a rounded corner between the portion of the substrate and the trench wall without the use of spacers covering the implant region;
  a dopant in the implant region thereby changing an electrical characteristic of the implant region and making a threshold voltage in the corner region about equivalent to or greater than a threshold voltage in a central area of the substrate underneath the oxide layer, the threshold voltage of the central area of the substrate being about substantially uniform; and
  a third layer forming a plug in a shallow trench isolation of the substrate.

28. An electronic system, comprising:
  a processor; and
  a memory device coupled to the processor, wherein the memory device includes:
    a substrate having at least one trench wall;
    a transistor structure on the substrate, the transistor structure formed from a process stack having:
      a first layer;
      a second layer;
      a portion of the substrate, the first and second layers having been pulled back a pull back distance from the trench wall thereby forming an exposed implant region;
    whereby the implant region has a rounded corner between the portion of the substrate and the trench wall without the use of spacers covering the implant region; and
    a dopant in the implant region having the same dopant type as the substrate type whereby the threshold voltage in the implant region is approximately equal to or greater than the threshold voltage on the portion of the substrate and whereby the pull back distance defines a width of the implant region which is approximately uniform around the process stack.

29. The electronic system according to claim 28, wherein the pull back distance is in a range from about 25 Å to about 300 Å.

30. The electronic system according to claim 28, wherein the pull back distance is substantially symmetrical about the transistor structure.

31. The electronic system according to claim 28, wherein the substrate further includes a central area underneath the transistor structure having a threshold voltage that is about substantially uniform.

32. The electronic system according to claim 31, wherein the dopant in the implant region changes an electrical characteristic of the implant region thereby making a threshold voltage in the implant region about equivalent to or greater than a threshold voltage in the central area of the substrate underneath the transistor structure.

33. The electronic system according to claim 28, wherein the substrate further includes a corner region that comprises a part of the implant region, the corner region having a rounded contour.

34. An electronic system, comprising:
a processor; and
a memory device coupled to the processor, wherein the memory device includes:
   a substrate having at least one trench wall;
   a transistor structure on the substrate, the transistor structure formed from a process stack having:
      a first layer;
      a second layer; and
      a portion of the substrate, the first and second layers having been pulled back a pull back distance from the trench wall thereby forming an implant region;
   whereby the implant region has a rounded corner between the portion of the substrate and the trench wall without the use of spacers covering the implant region; and
   a dopant in the implant region and the substrate at the at least one trench wall, the implant region having the same dopant type as the substrate type whereby the threshold voltage in the implant region is approximately equal to or greater than the threshold voltage on the portion of the substrate and whereby the pull back distance defines a width of the implant region which is approximately uniform around the process stack.

35. The electronic system according to claim 34, wherein the substrate is a P-type substrate and the dopant is a P-type dopant.

36. The electronic system according to claim 34, wherein the substrate is an N-type substrate and the dopant is an N-type dopant.

37. The electronic system according to claim 34, wherein the dopant in the implant region is present in a thickness range from about 200 Å to about 1000 Å.

38. The electronic system according to claim 34, wherein the dopant is one of Arsenic, Antimony, Indium, Phosphorous and BF2.

39. The electronic system according to claim 34, wherein the dopant has an implant energy in a preferred implant energy range from about 5 to about 25 keV.

40. The electronic system according to claim 39, wherein the implant energy is in a more preferred implant energy range of less than or equal to about 10 keV.

41. The electronic system according to claim 34, wherein the dopant in the implant region occupies the region in a concentration of about 1 part per million.

42. An electronic system, comprising:
a processor; and
a memory device coupled to the processor, wherein the memory device includes:
   a substrate having at least one trench wall;
   a transistor structure on the substrate, the transistor structure formed from a process stack having:
      a first layer;
      a second layer; and
      a portion of the substrate, the first and second layers having been pulled back a pull back distance from the trench wall thereby forming an implant region having a migration region adjacent the transistor structure;
   whereby the implant region has a rounded corner between the portion of the substrate and the trench wall without the use of spacers covering the implant region; and
   a dopant in the implant region and the migration region, the implant region having the same dopant type as the substrate type whereby the threshold voltage in the implant region is approximately equal to or greater than the threshold voltage on the portion of the substrate and whereby the pull back distance defines a width of the implant region which is approximately uniform around the process stack.

43. The electronic system according to claim 42, wherein the substrate further includes a central area underneath the transistor structure having a threshold voltage that is about substantially uniform.

44. The electronic system according to claim 43, wherein the dopant in the implant region and the migration region changes an electrical characteristic of the implant region and the migration region thereby making a threshold voltage in the implant region and the migration region about equivalent to or greater than a threshold voltage in the central area of the substrate underneath the transistor structure.

45. An electronic system, comprising:
a processor; and
a memory device having reduced transistor leakage attributes coupled to the processor, wherein the memory device includes:
   a substrate having a surface, a corner region and at least one trench wall;
   a transistor structure on the substrate, the transistor structure formed from a process stack having:
      an oxide layer on the substrate;
      a nitride layer on the oxide layer; and
      a portion of the substrate wherein the process stack extends away from the surface, the oxide layer and the nitride layer being a pull back distance in a range from about 25 Å to about 300 Å from the trench wall thereby forming an implant region, the pull back distance being substantially symmetrical about the nitride layer, the corner region of the substrate including a part of the implant region;
   whereby the implant region has a rounded corner between the portion of the substrate and the trench wall without the use of spacers covering the implant region; and
   a dopant in the implant region thereby changing an electrical characteristic of the implant region and making a threshold voltage in the corner region about equivalent to or greater than a threshold voltage in a central area of the substrate underneath the transistor structure, the threshold voltage of the central area of the substrate being about substantially uniform.

46. The electronic system according to claim 45, wherein the dopant is one of Boron, Arsenic, Antimony, Indium, Phosphorous and BF2.

47. The electronic system according to claim 45, wherein the corner region has a rounded contour.

* * * * *

UNITED STATES PATENT AND TRADEMARK OFFICE
CERTIFICATE OF CORRECTION

| | | |
|---|---|---|
| PATENT NO. | : 7,105,899 B2 | |
| APPLICATION NO. | : 10/053300 | |
| DATED | : September 12, 2006 | |
| INVENTOR(S) | : Agarwal et al. | |

It is certified that error appears in the above-identified patent and that said Letters Patent is hereby corrected as shown below:

On Title Page Item (57), under "Abstract", in column 2, line 7, delete "p–typing" and insert -- p– typing --, therefor.

On Title Page Item (56) under "U.S. Patent Documents", in column 2, below line 9, insert --

| | | |
|---|---|---|
| 5,674,775 | 10/1997 | Ho et al. |
| 5,811,346 | 09/1998 | Sur et al. |
| 5,866,458 | 02/1999 | Lee |
| 5,989,975 | 11/1999 | Kuo |
| 5,998,852 | 12/1999 | Berry et al. |
| 6,097,069 | 08/2000 | Brown et al. |
| 6,174,786 | 01/2001 | Kelley et al. |
| 6,287,921 | 09/2001 | Chern --. |

In column 2, line 1, delete "p–typing" and insert -- p– typing --, therefor.

In column 2, line 10, delete "comer" and insert -- corner --, therefor.

In column 2, line 13, delete "comer" and insert -- corner --, therefor.

In column 5, line 56, delete "comer" and insert -- corner --, therefor.

In column 5, line 58, delete "comer" and insert -- corner --, therefor.

In column 6, line 41, delete "M122–930," and insert -- MI22–930, --, therefor.

In column 6, line 42, delete "1998" and insert --1998, now U.S. Patent No. 6,372,601, --, therefor.

In column 7, line 28, delete $705_I$" and insert -- $705_1$ --, therefor.

In column 9, line 2, delete "comer" and insert -- corner --, therefor.

UNITED STATES PATENT AND TRADEMARK OFFICE
CERTIFICATE OF CORRECTION

PATENT NO.         : 7,105,899 B2                                         Page 2 of 2
APPLICATION NO. : 10/053300
DATED              : September 12, 2006
INVENTOR(S)        : Agarwal et al.

It is certified that error appears in the above-identified patent and that said Letters Patent is hereby corrected as shown below:

In column 11, line 48, in Claim 23, delete "or" and insert -- of --, therefor.

Signed and Sealed this

Thirteenth Day of March, 2007

JON W. DUDAS
*Director of the United States Patent and Trademark Office*